US006669121B2

(12) United States Patent
Kasai

(10) Patent No.: US 6,669,121 B2
(45) Date of Patent: Dec. 30, 2003

(54) HOLDER SUPPORT DEVICE

(75) Inventor: Toru Kasai, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 10/216,096

(22) Filed: Aug. 9, 2002

(65) Prior Publication Data
US 2003/0047689 A1 Mar. 13, 2003

(30) Foreign Application Priority Data

Aug. 10, 2001 (JP) ........................................ 2001-245062

(51) Int. Cl.[7] ........................... G01N 23/00; G21K 5/10; G21K 5/08; G02B 21/26
(52) U.S. Cl. ................ 250/442.11; 250/310; 250/311; 250/440.1; 250/440.11; 250/441.11; 359/393; 414/217
(58) Field of Search ...................... 250/311, 440.11, 250/442.11, 310, 440.1, 441.11; 359/393; 414/217

(56) References Cited

U.S. PATENT DOCUMENTS 5,001,350 A * 3/1991 Ohi et al. ............... 250/440.11
5,039,864 A * 8/1991 Kondo .................... 250/442.11
5,581,088 A   12/1996 Kasai ..................... 250/440.11
6,259,960 B1 * 7/2001 Inokuchi .................... 700/110
6,469,309 B1 * 10/2002 Kasai ..................... 250/442.11

FOREIGN PATENT DOCUMENTS

JP          2000268758         9/2000

* cited by examiner

Primary Examiner—Bruce Anderson
Assistant Examiner—Mary El-Shammaa
(74) Attorney, Agent, or Firm—Webb Ziesenheim Logsdon Orkin & Hanson, P.C.

(57) ABSTRACT

A holder support device in an electron microscope. The device has a detachable cylindrical holder extending along the X-axis. The holder support device permits the position of the inner end of the holder to be adjusted along the X-, Y-, and Z-axes and about the angular position about the X-axis. The support device has an inner cylinder rotatably held to an outer cylinder. The inner cylinder is provided with a holder through-hole and a pin guide hole. The holder is slidably held in the holder through-hole. The pin guide hole guides a pin on the holder when it is inserted into the holder through-hole. The outer cylinder is provided with a circumferential guide hole and axial guide holes.

5 Claims, 10 Drawing Sheets

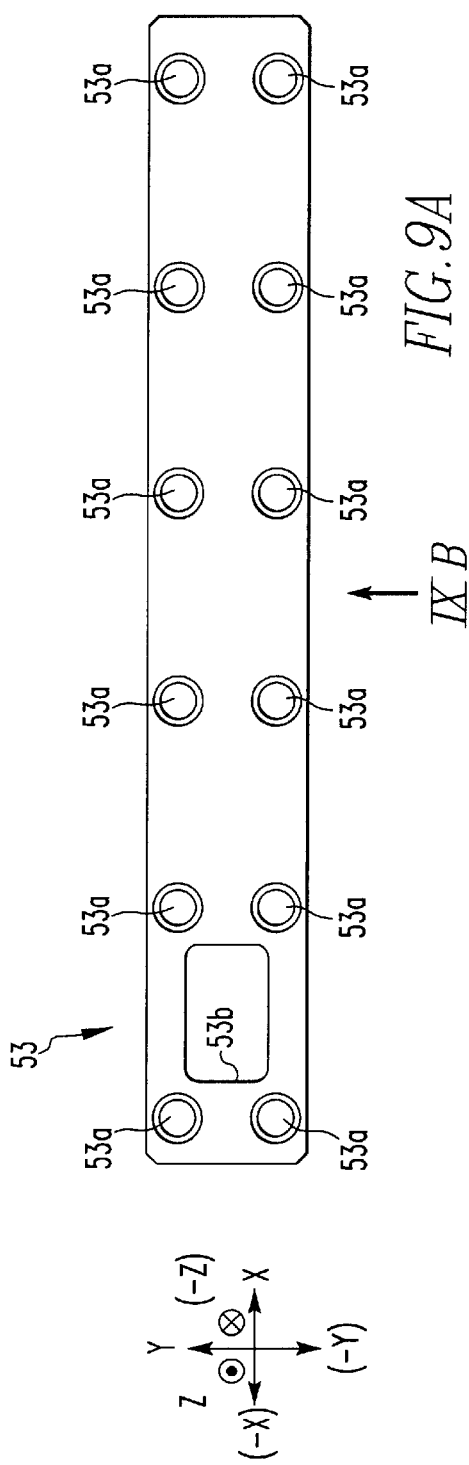
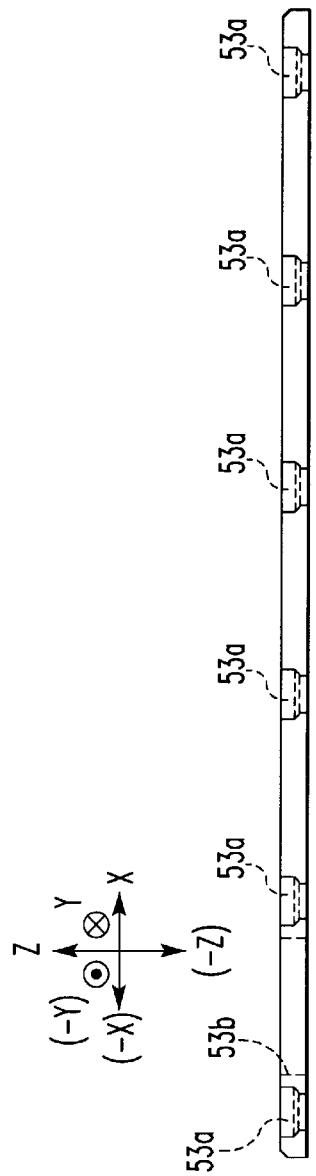
FIG. 9A
FIG. 9B
FIG. 9C

HOLDER SUPPORT DEVICE

BACKGROUND OF THE INVENTION

1. Field of the Invention

The present invention relates to a holder support device for supporting various holders, such as specimen holders and aperture holders, used in apparatus making use of a charged-particle beam, such as an electron microscope.

2. Description of Related Art

A holder support device for supporting a specimen holder for use with an electron microscope, or the like, is described in Japanese patent laid-open No. 2000-268758, where the holder support member, indicated by numeral 23, extends through the microscope column (outer wall) of the microscope and has a cylindrical wall 24. This wall 24 has a slider-receiving groove 24c in its outer-end portion. The groove 24c accommodates a guide pin H4 on the specimen holder H and a slider 51. The holder H is mounted on the cylindrical wall 24. Atmospheric pressure acting on the outer end of the holder H urges it toward its inner end. A holder inner end-positioning drive mechanism (X-position adjustment device) bearing against the inner end of the holder H places it in position along the axis of the holder.

The above-cited Japanese laid-open publication also describes a spring 63 for preventing the slider 51 from moving toward the inner end to alleviate the pressure applied on the holder inner-end positioning mechanism (X-position adjustment device) by the specimen holder H, which, in turn, is pushed toward the inner end by atmospheric pressure. The guide pin H4 on the holder H engages the slider 51.

U.S. Pat. No. 5,581,088 (corresponding to Japanese patent laid-open No. 124508/1996) also describes a specimen holder (holder support device) in which a specimen-holding rod (holder) 22 fitted with a pin 27 for opening and closing a partition valve 10 is held to a third pipe 17. The specimen holder has an X drive means 30 for adjusting the position of the specimen-holding rod 22 that moves together with the third pipe 17 in the X-axis direction, by controlling the X-position of a shaft 56 mounted to the third pipe 17.

In the technique of the above-cited Japanese patent laid-open No. 2000-268758, the pressure applied to the X-position-adjusting device (inner-end positioning mechanism) is alleviated and so accurate adjustment of the position of the specimen holder H is permitted. The X-position adjusting device is mounted on the outer wall (microscope column) on the opposite side of the holder support device. In the case of a transmission electron microscope, therefore, the space formed around the specimen holder and permitting installation of other attachments, such as observational instrument and analytical instrument, is narrowed.

In the case of an apparatus that needs a large specimen chamber space, such as a scanning electron microscope, X-ray microanalyzer, or focused ion beam (FIB) system, if an X-position adjusting device is mounted on the opposite surface of the holder support device, the distance between the holder support device and the X-position adjusting device will be increased. Therefore, this apparatus is difficult to manufacture.

In the technique of the above-cited U.S. Pat. No. 5,581,088, the X-position adjusting device for placing the specimen holder in position in the X-axis direction is mounted to the holder support device together with other position adjusting devices. Therefore, the problem with the above-cited Japanese patent laid-open No. 2000-268758 does not take place. However, a first pipe 7 and a second pipe 15 are used in addition to the third pipe 17 described above. A bellows 19 is mounted between the second pipe 15 and third pipe 17. The partition valve 10 is opened and closed by the pin 27 of the specimen-holding rod 22. The shaft 56 is mounted to the third pipe 17, and the position of the specimen-holding rod 22 is adjusted. Consequently, the specimen-holding device (holder support device) is complex in structure.

SUMMARY OF THE INVENTION

It is an object of the present invention to provide a holder support device which has a detachable cylindrical holder extending along the X-axis, permits adjustment of the X-, Y-, and Z-positions of the inner end of the holder, as well as adjustment of the rotational position about the X-axis, and enables a partition valve to be opened and closed.

This object is achieved by the present invention by a holder support device comprising: a cylindrical support member extending through a specimen chamber wall and mounted to this wall; an outer cylinder inserted in the support member and capable of swinging in the Y- and Z-axis directions about a spherical bearing formed on the inner surface of the support member; an inner cylinder rotatably mounted in the outer cylinder; a holder rotatably mounted in the inner cylinder and made slidable by an X-position adjusting device; a partition valve placed between the inner cylinder and a specimen chamber; and a mechanism for opening and closing the partition valve by rotation of the inner cylinder that is rotated by the holder when the holder rotates.

Other objects and features of the invention will appear in the course of the description thereof, which follows.

BRIEF DESCRIPTION OF THE DRAWING(S)

FIGS. 7A–7C illustrate the outer cylinder, inner cylinder, and holder of the holder support device, and in which FIG. 7A is a perspective view of the outer cylinder, FIG. 7B is a perspective view of the inner cylinder, and FIG. 7C is a perspective view of the holder;

Figure 8A:
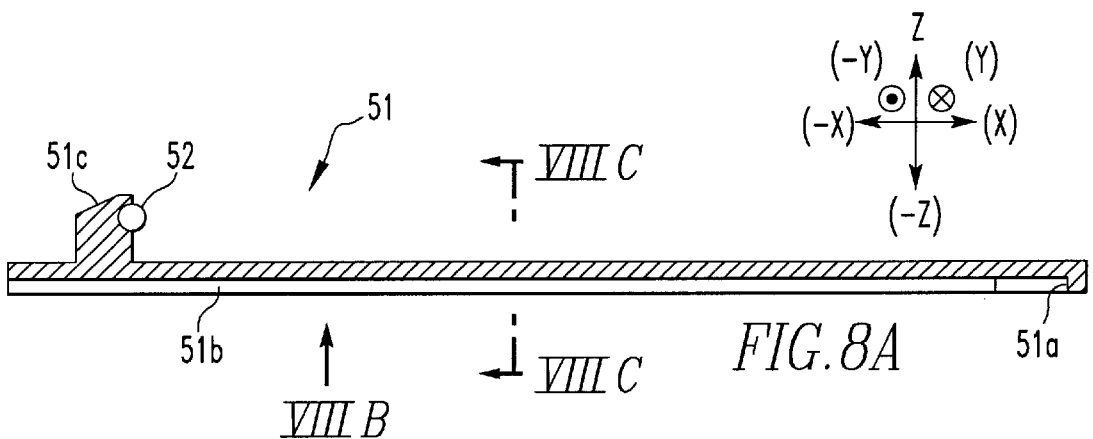
Figure 8B:
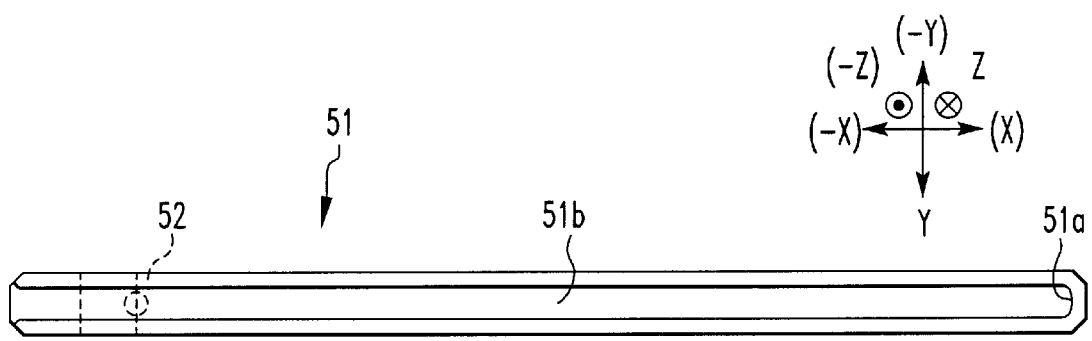
Figure 8C:
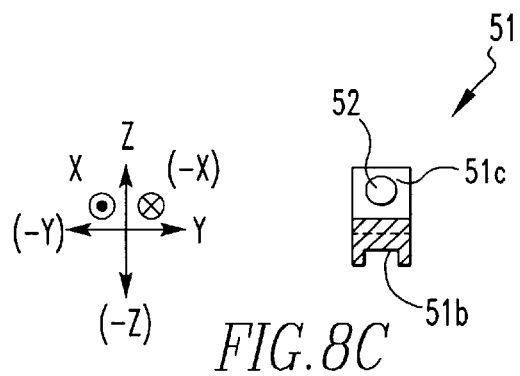
Figure 10:
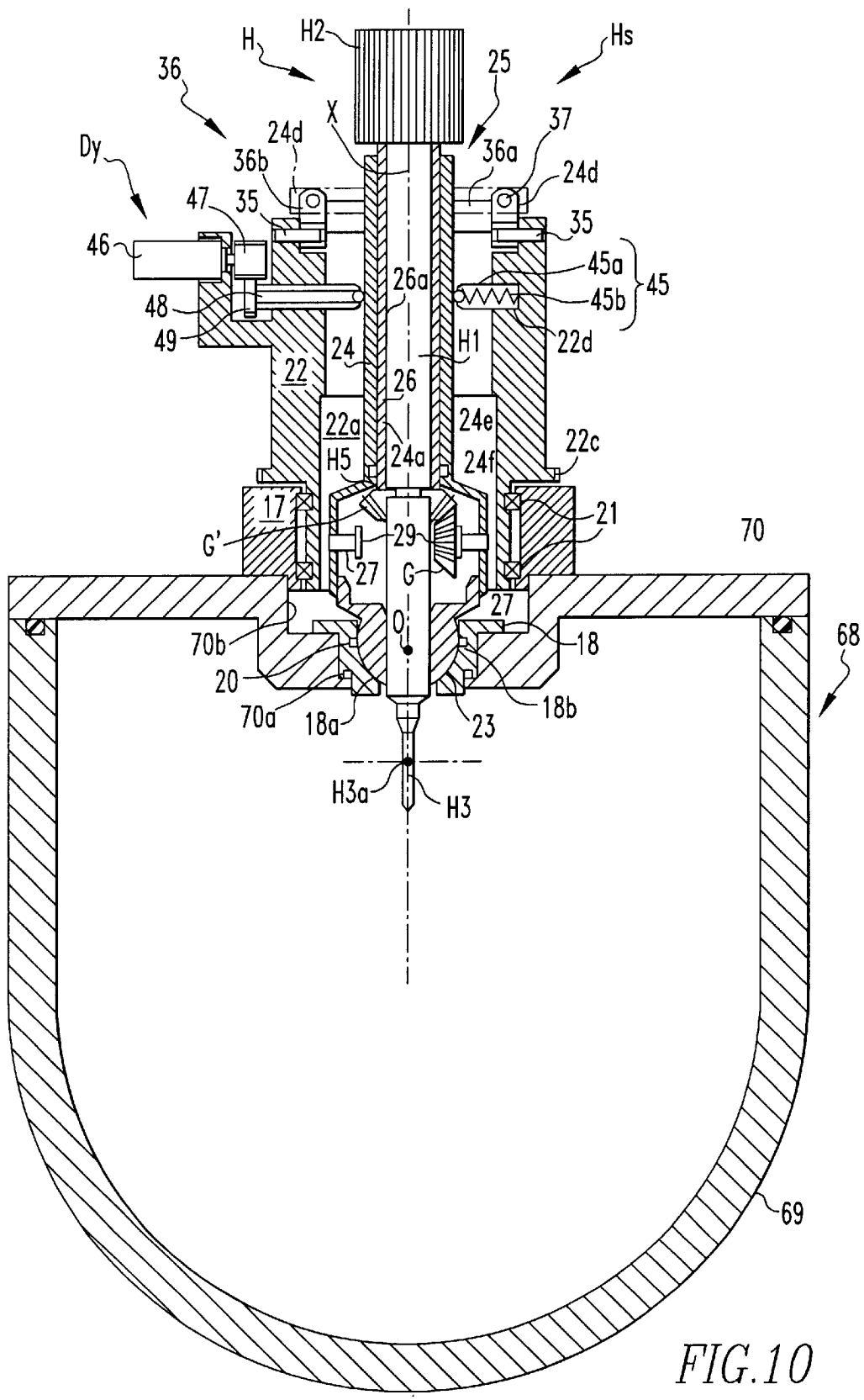

FIGS. 8A–C illustrate a slider used in the holder support device, and in which FIG. 8A is a cross-sectional view of the slider, FIG. 8B is a view taken from the direction indicated by the arrow VIIIB of FIG. 8A, and FIG. 8C is a cross-sectional view taken on line VIIIC—VIIIC of FIG. 8A;

FIGS. 9A–9C illustrate a slider-holding plate that holds the slider, and in which FIG. 9A is a plan view of the slider-holding plate, FIG. 9B is a side elevation as viewed from the direction indicated by the arrow VIIIB of FIG. 9A, and FIG. 9C is a view as viewed from the direction indicated by the arrow IXC of FIG. 9B; and FIG. 10 is a plan view in cross section of a holder support device according to Embodiment 2 of the present invention.

DESCRIPTION OF THE PREFERRED EMBODIMENT(S)

Preferred embodiments of the present invention are next described with reference to the accompanying drawings.

For ease of understanding the following description, the forward and rearward direction is taken as the X-axis direction. The left and right direction is taken as the Y direction. The left and right direction is taken as the Z direction. The direction or side indicated by the arrow X is the forward direction or front side. The direction or side indicated by the arrow -X is the backward direction or back side. The direction or side indicated by the arrow Y is the leftward direction or left side. The direction or side indicated by the arrow -Y is the rightward direction or right side. The direction or side indicated by the arrow Z is the upward direction or upper side. The direction or side indicated by the arrow -Z is the downward direction or lower side.

The direction indicated by symbol ⊙ is a direction pointing from the rear side of the plane of the paper to the front side. The direction indicated by symbol ⊗ is a direction pointing from the front side of the plane of the paper to the rear side.

(Embodiment 1)

Figure 1:
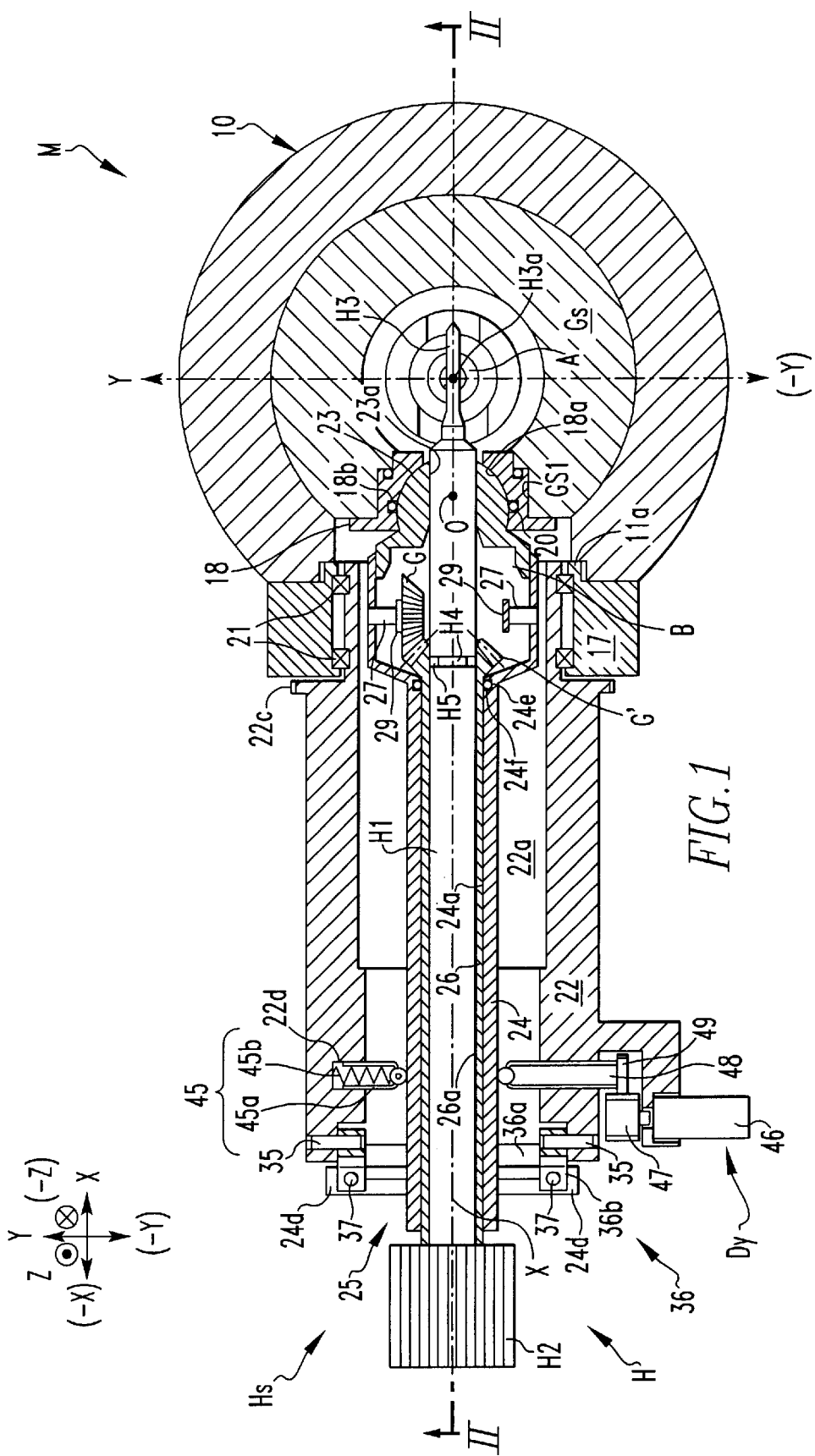
FIG. 1 is a plan view in cross section of main portions of a transmission electron microscope equipped with a holder support device according to Embodiment 1 of the present invention.
Figure 2:
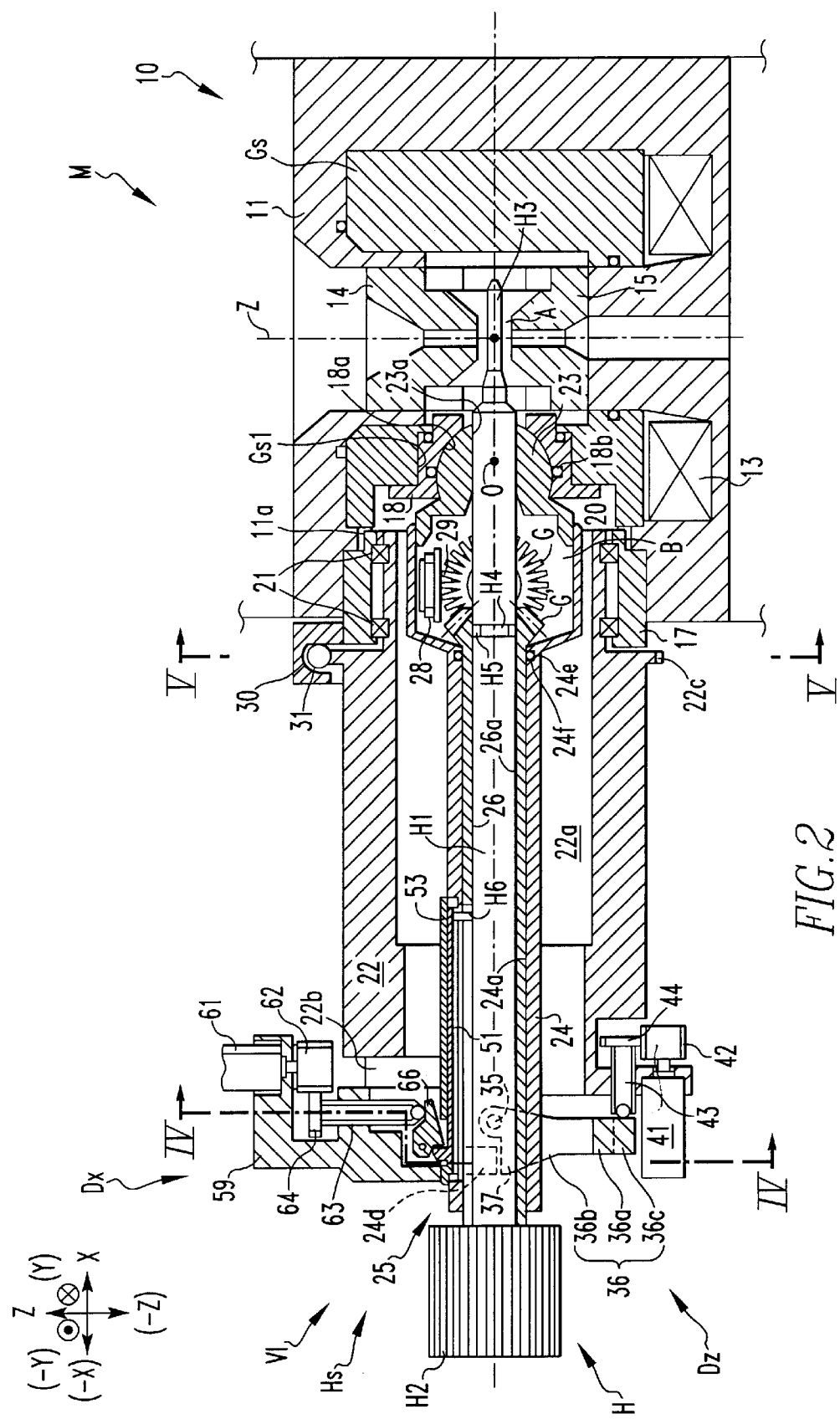
FIG. 2 is a cross-sectional view taken on line II—II of FIG. 1.
Figure 3:
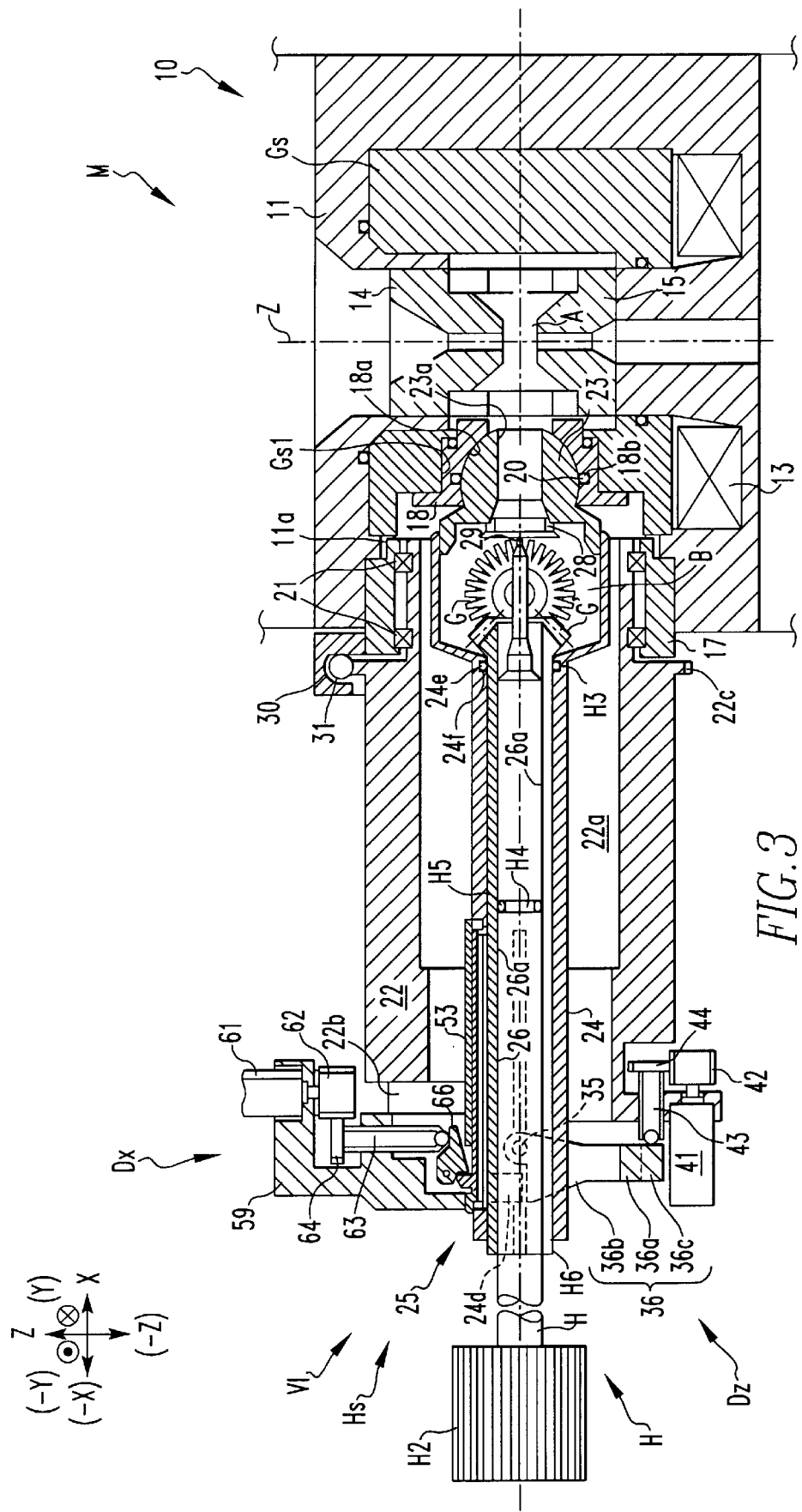
FIG. 3 is a view similar to FIG. 2, illustrating the operation of the holder support device.
Figure 4:
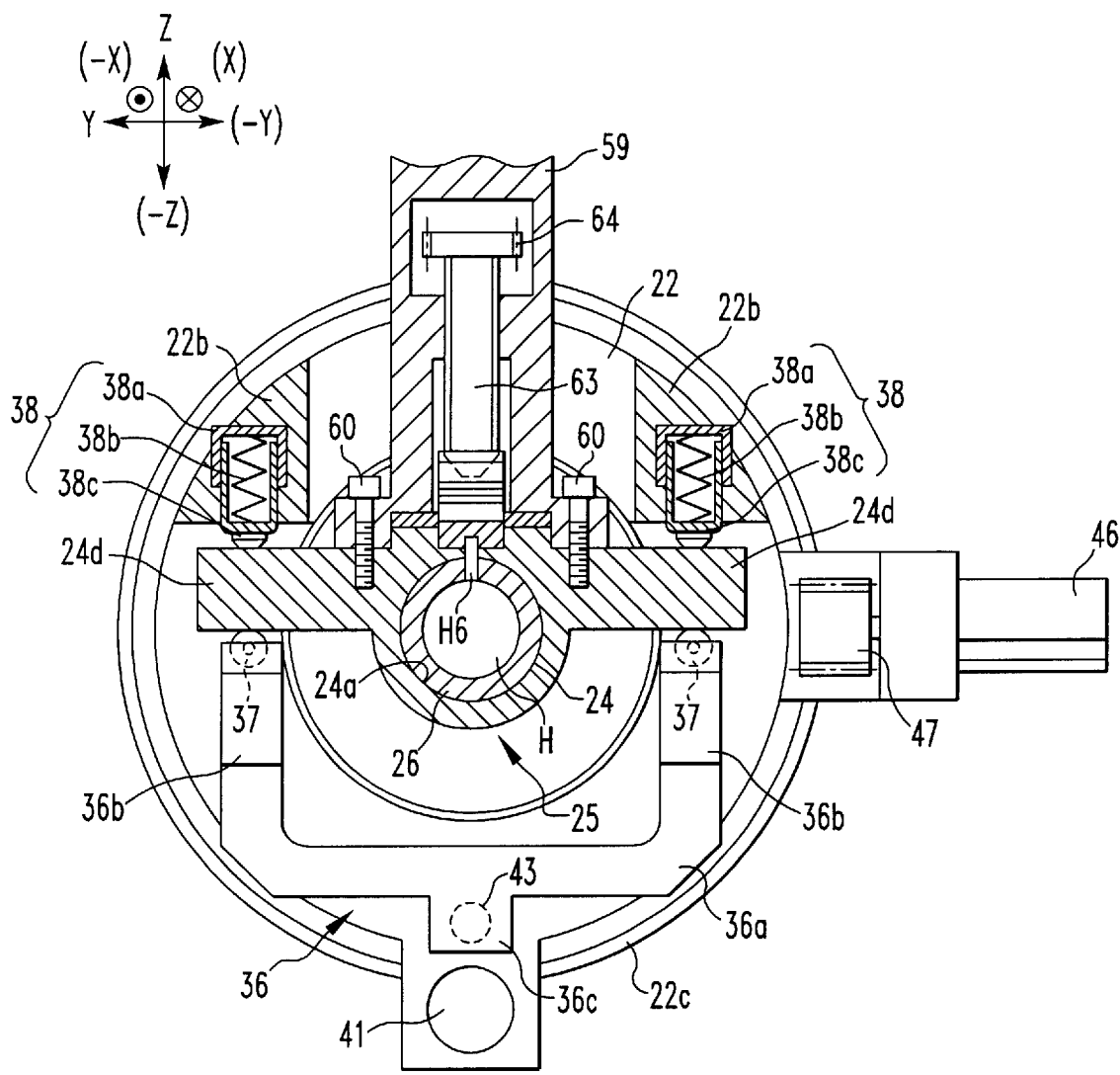
FIG. 4 is a cross-sectional view taken on line IV—IV of FIG. 2.
Figure 5:
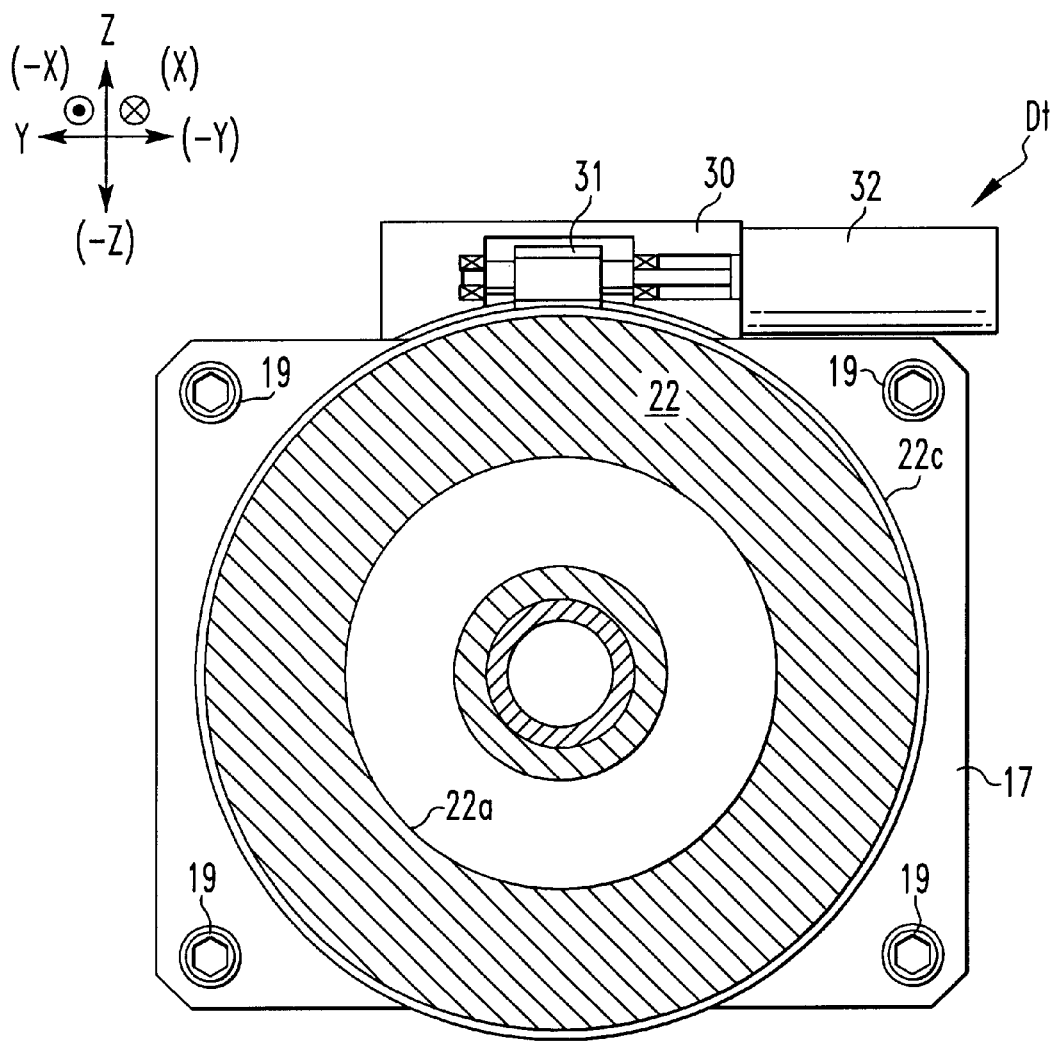
FIG. 5 is a cross-sectional view taken on line V—V of FIG. 2.
Figure 6:
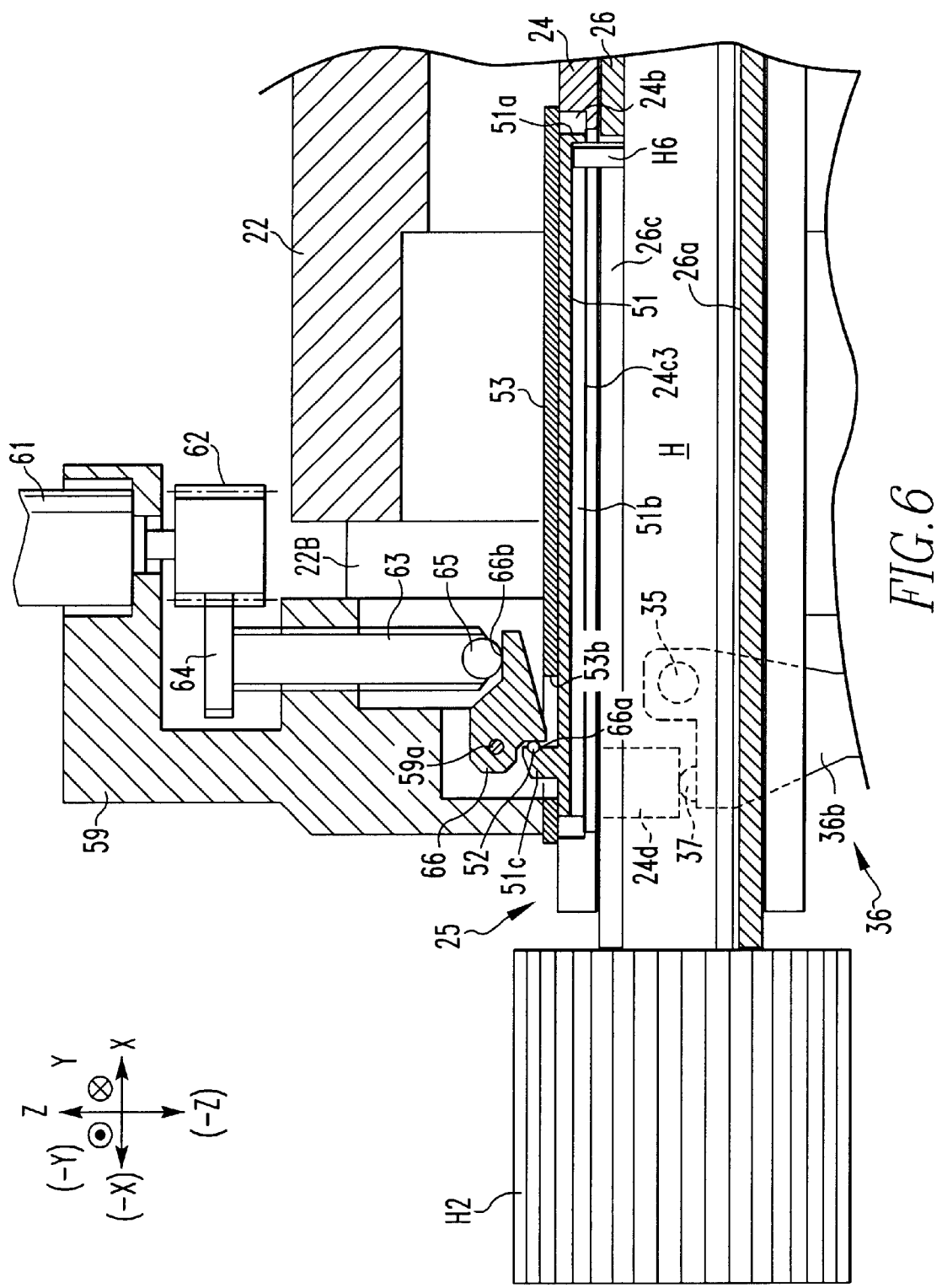
FIG. 6 is an enlarged view of main portions of the holder support device indicated by the arrow VI of FIG. 2.
Figure 7A:
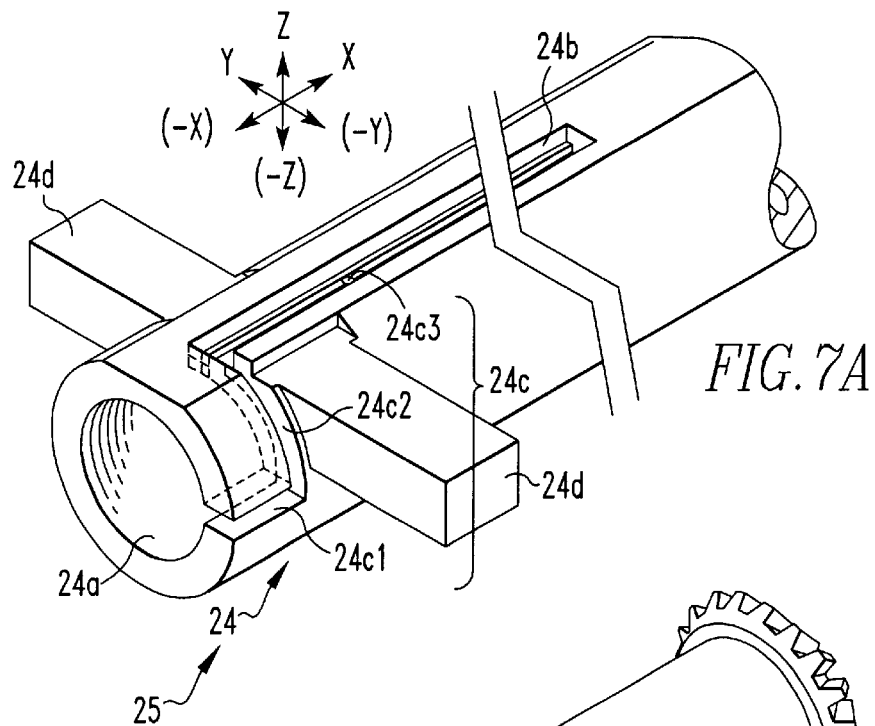
Figure 7B:
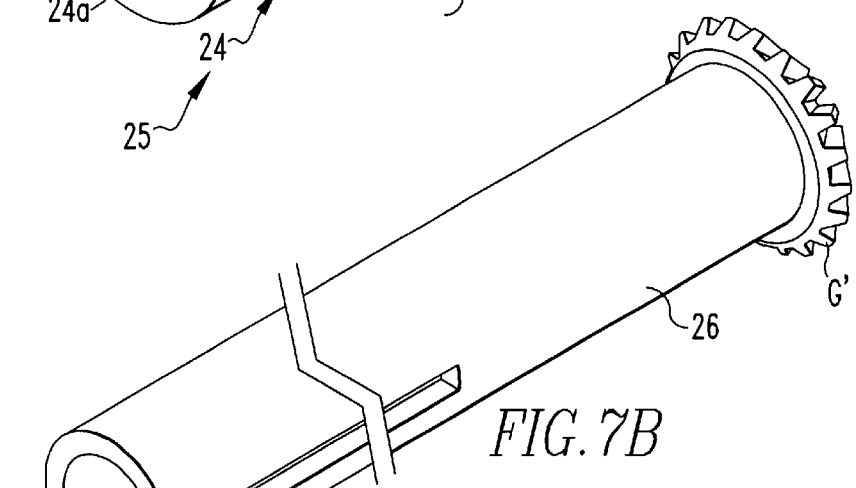
Figure 7C:
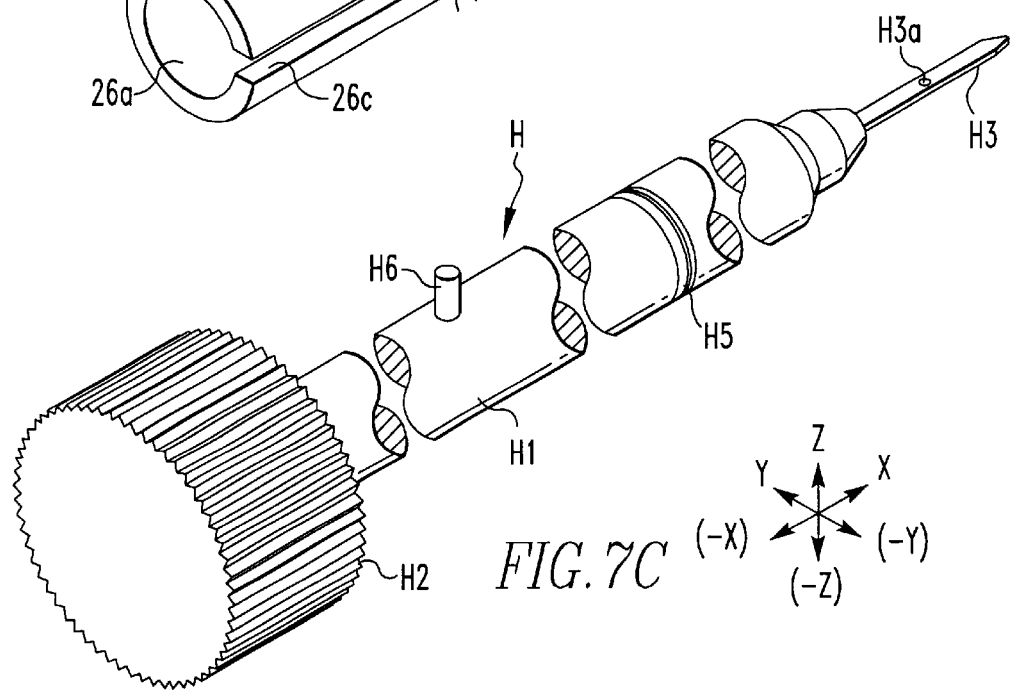

FIG. 1 is a plan view in cross section of main portions of a transmission electron microscope fitted with a holder support device according to Embodiment 1 of the present invention. FIG. 2 is a cross-sectional view taken on line II—II of FIG. 1. FIG. 3 is a view similar to FIG. 2, illustrating the operation of the holder support device of this embodiment. FIG. 4 is a cross-sectional view taken on line IV—IV of FIG. 2. FIG. 5 is a cross-sectional view taken on line V—V of FIG. 2. FIG. 6 is an enlarged view of main portions of the holder support device indicated by the arrow VI of FIG. 2. FIGS. 7A–7C illustrate the outer cylinder, inner cylinder, and holder of the holder support device, and in which FIG. 7A is a perspective view of the outer cylinder, FIG. 7B is a perspective view of the inner cylinder, and FIG. 7C is a perspective view of the holder. FIGS. 8A–8C illustrate a slider used in the holder support device, and in which FIG. 8A is a cross-sectional view of the slider, FIG. 8B is a view taken from the direction indicated by the arrow VIIIB of FIG. 8A, and FIG. 8C is a cross-sectional view taken on line VIIIC—VIIIC of FIG. 8A. FIGS. 9A–9C illustrate a slider-holding plate for holding the slider, and in which FIG. 9A is a plan view of the slider-holding plate, FIG. 9B is a side elevation taken from the direction indicated by the arrow VIIIB of FIG. 9A, and FIG. 9C is a view taken from the direction indicated by the arrow IXC of FIG. 9B.

Referring to FIGS. 1 and 2, a transmission electron microscope M has a microscope column 10 extending in the up and down direction (i.e., in the Z-axis direction). The interior of the microscope column 10 is maintained in a vacuum. The microscope column 10 has a lens yoke 11 having a cylindrical outer surface and a substantially cylindrical goniostage Gs held inside the lens yoke 11. This yoke 11 is made of a magnetic material, while the goniostage Gs is made of a nonmagnetic material. The lens yoke 11 forms a part of an outer wall.

As shown in FIG. 2, the lens yoke 11 supports exciting coils 13 and upper polepiece 14 and lower polepiece 15 of an electron lens. The polepieces 14 and 15 are each provided with a hole permitting passage of electrons. A specimen chamber A is formed between the upper polepiece 14 and lower polepiece 15 of the lens inside the goniostage Gs.

Referring still to FIGS. 1 and 2, the lens yoke 11 has a goniometer installation hole (cylindrical bearing member installation hole) 11a in its rear portion (i.e., on the -X side) to place the outside of the lens yoke 11 in communication with the specimen chamber A. Similarly, the goniostage Gs has a goniometer installation hole (support member installation hole) Gs1 in its rear portion (i.e., on the -X side). These holes 11a and Gs1 are formed coaxially about the X-axis. A cylindrical bearing member 17 has a reduced-diameter portion in its front end, the smaller-diameter portion being inserted in the goniometer installation hole 11a of the lens yoke 11. The bearing member 17 also has a rear flange portion fixedly mounted to the lens yoke 11 with bolts 19 (FIG. 5). A cylindrical support member 18 is fitted in the goniometer installation hole Gs1 formed in the goniostage Gs that is a part of the specimen chamber wall. This support member 18 is provided with a holder through-hole extending in the X-axis direction (in the forward and rearward direction). A spherical bearing 18a is formed at the inner end. The center of the spherical bearing 18a is on the X-axis. An O-ring groove 18b is formed in the spherical bearing 18a of the support member 18. An O-ring 20 for vacuum sealing is fitted in the O-ring groove 18b.

The cylindrical bearing member 17 is so placed that the axis of its cylindrical inner surface is parallel to the X-axis and passes through the center O of a spherical surface formed by the support member 18.

In FIGS. 1 and 2, bearings 21 of a pair are mounted in the inner surface of the cylindrical bearing member 17. A hollow rotating member 22 is held by the bearings 21 so as to be rotatable about the X-axis. An outer cylinder through-hole 22a is formed in the inner side of the rotating member 22. A gear 22c (FIG. 5) is formed on the outer surface.

In FIG. 2, a left support member 22b and a right support member 22b (see FIG. 4) which form a pair and are used for a push member (described later) extend rearwardly above and behind the rotating member 22.

Referring again to FIGS. 1 and 2, a spherical body portion 23 is held to the spherical bearing 18a of the support member 18 so as to be rotatable about the center of spherical surface O. The spherical body portion 23 has a holder through-hole 23a. A cylindrical portion 24 has its front end integrally fixed to the spherical body portion 23. The spherical body portion 23 and cylindrical portion 24 together form an outer cylinder 25. The space surrounded by the spherical body portion 23 and the front end of the cylindrical portion 24 is designed as a preliminary evacuation chamber B. An inner cylinder through-hole 24a is formed in the inner side of the cylindrical portion 24 of the outer cylinder 25.

As shown in FIG. 7A, the outer cylinder 25 has a flat top surface portion behind the cylindrical portion 24. A slider accommodation groove 24b extending axially is formed in this flat portion. The cylindrical portion 24 has an outer guide hole 24c consisting of successive holes, i.e., an axial guide hole 24c1 on the outer end side, a circumferential guide hole 24c2, and another axial guide hole 24c3 on the inner end side. The axial guide hole 24c1 extends axially from the rear end (outer end) to the front end (inner end). The circumferential guide hole 24c2 circumferentially extends at right angles to the axial guide hole 24c1. The axial guide hole 24c3 on the inner end side extends axially at right angles to the circumferential guide hole 24c2. The outer guide hole 24c is formed in the bottom of the slider accommodation groove 24b and narrower than the groove 24b. The cylindrical portion 24 has a rear portion (located on the -X side) having left and right swelling portions 24d (FIG. 4) formed along the circumferential guide hole 24c2. Each of these swelling portions 24d is prismatic and has flat top and bottom surfaces. A seal ring installation groove 24e is formed in the front end of the inner cylinder through-hole 24a. A seal ring (O-ring) 24f is mounted in the groove 24e.

Referring to FIGS. 1, 2, and 7B, the inner cylinder 26 is rotatably inserted in the inner cylinder through-hole 24a of the cylindrical portion 24 of the outer cylinder 25. A holder through-hole 26a is formed in the inner side of the inner cylinder 26. A bevel gear G' is mounted on the front end of the inner cylinder 26. A pin guide hole 26c (FIG. 7B) is formed axially from the rear end (outer end on the -X side) to the front end (inner end on the X side).

As shown in FIG. 1, pins 27 of a pair are mounted opposite to each other at the inner end of the cylindrical portion 24 of the outer cylinder 25. A bevel gear G is rotatably held to one pin 27. Both ends of a U-shaped arm 29 are rotatably held to the pins 27. One end of the arm 29 is connected to the bevel gear G.

The U-shaped arm 29 has an intermediate portion to which a partition valve 28 is held (FIG. 2). Thus, when the bevel gear G rotates, the partition valve 28 opens and closes the holder through-hole 23a in the spherical body portion 23.

Referring to FIG. 7C, the holder H has a holder pipe H1. A grip H2 for manual operation is mounted to the rear end (outer end) of the holder pipe H1. A specimen-holding portion H3 in the form of a flat plate is supported to the front end, i.e., the inner end. An accommodation portion H3a for accommodating a specimen (not shown) is formed in the specimen-holding portion H3. An O-ring groove H4 (FIGS. 1 and 2) is formed in the outer surface of the holder pipe H1. An O-ring H5 for vacuum sealing is fitted in the O-ring groove H4. A pin H6 protrudes from around the center of the outer surface of the holder pipe H1. This pin H6 can engage both outer guide hole 24c in the cylindrical portion 24 of the outer cylinder 25 and pin guide hole 26c in the inner cylinder 26.

The aforementioned preliminary evacuation chamber B is sealed by the O-ring H5 for vacuum sealing and by the seal ring 24f. Under the condition shown in FIG. 3 where the partition valve 28 is closed, the chamber can be evacuated to a vacuum by a pumping system (not shown). A mechanism for opening and closing the partition valve is made up of the components 25–29, G, and H.

(Device Dt for Adjustment of the Rotational Position about X-axis)

Referring to FIGS. 2 and 5, a gear holder 30 is mounted on the upper end of the cylindrical bearing member 17. A worm gear 31 (FIG. 5) engaging with the gear 22c of the rotating member 22 is rotatably held to the gear holder 30. An electric motor 32 for driving about the X-axis is mounted to the left side of the gear holder 30. The motor 32 is connected to the left end of a shaft extending through the gear holder 30 on the worm gear 31.

Therefore, when the motor 32 for driving about X-axis is driven forward or backward, the rotating member 22 is rotated forward or backward about the X-axis via the worm gear 31 and gear 22c. A device Dt for adjustment of the rotational position about the X-axis is made up of the components 22, 30, 31, and 32.

(Z-Position Adjusting Device Dz)

In FIGS. 1 and 2, shafts 35 of a pair are mounted opposite to each other at the rear end of the rotating member 22. A swinging member 36 (see FIGS. 4 and 6) is swingably held by these shafts 35.

Referring to FIG. 4, the swinging member 36 has a horizontal portion 36a extending in the left and right direction (in the Y-axis direction), upwardly protruding portions 36b formed at the opposite ends of the horizontal portion 36a, and a downwardly protruding portion 36c (FIG. 2) protruding downwardly from the center of the horizontal portion 36a.

The shafts 35 of a pair extend through upper-end portions of the upwardly protruding portions 36b (FIGS. 4 and 6), respectively, so that the swinging member 36 is rotatably held to the rotating member 22.

As shown in FIGS. 4 and 6, abutting spheres 37 are held to sphere support surfaces formed on the upper ends of the upwardly protruding portions 36b of the swinging member 36. These spheres 37 bear against the lower surfaces of the swelling portions 24d, respectively, of the cylindrical portion 24 of the outer cylinder 25.

Referring particularly to FIG. 4, spring support cylinders 38a are disposed on left and right support portions 22b (FIGS. 4 and 2), respectively, of the rotating member 22 for a push member. A compression spring 38b and a slidable push member 38c are inserted in each of the spring support cylinders 38a. The front end of each push member 38c pushes against the top surface of the corresponding one of the swelling portions 24d of the outer cylinder 25 via the corresponding compression spring 38b. The push member, 38, for adjusting the vertical position is made up of the components 38a, 38b, and 38c.

As shown in FIG. 2, an electric motor 41 (see FIGS. 2 and 4) for vertical adjustment is mounted behind and below the rotating member 22. A drive gear 42 is firmly mounted to the drive shaft of the motor 41. A thread 43 for vertical adjustment is screwed in a threaded hole formed in the rotating member 22. The rear end (on the -X side) of the thread 43 for vertical adjustment bears against the front side surface (on the X side) of the downwardly protruding portion 36c of the swinging member 36. A follower gear 44 in mesh with the drive gear 42 is firmly mounted to the front end (on the X side).

When the motor 41 for vertical adjustment is driven forward or backward, the thread 43 for vertical adjustment is rotated forward or backward via the drive gear 42 and follower gear 44. The thread is moved forward or backward according to the direction of rotation.

Forward or backward motion of the thread 43 for vertical adjustment swings the swinging member 36 about the shaft 35, the swinging member 36 holding the swelling portions 24d of the outer cylinder 25 pushed by the push member 38 for adjustment of the vertical position. The outer cylinder 25 is rotated around the center of spherical surface O. Thus, the vertical position (Z-position) of the inner end of the holder H can be adjusted. A Z-position adjusting device Dz is made up of the components 35–38 and 41–44.

(Y-Position Adjusting Device Dy)

Referring back to FIG. 1, a spring-receiving portion 22d is formed to the right (on the Y side) of and behind (on the -X side) the rotating member 22. A cylindrical push member 45a is slidably inserted in the spring-receiving portion 22d. The front end of the push member 45a pushes against the right side surface of a rear portion of the outer cylinder 25 by a compression spring 45b. A push member 45 for adjustment of the horizontal position is composed of the components 45a and 45b.

In FIG. 1, an electric motor 46 for adjustment of the horizontal (left-right) position is mounted to the left of and behind the rotating member 22. A drive gear 47 is securely mounted to the drive shaft of the motor 46 for adjustment of the horizontal position. A thread 48 for adjustment of the horizontal position is screwed in a threaded hole formed in the rotating member 22. The right end of the thread 48 for adjustment of the horizontal position bears against the left side surface (on the -Y side) of the rear portion (on the -X side) of the outer cylinder 25. A follower gear 49 in mesh with the drive gear 47 is securely fixed to the left end of the thread 48 for adjustment of the horizontal position.

When the motor 46 for adjustment of the horizontal position is driven forward or backward, the thread 48 for adjustment of the horizontal position is rotated forward or backward via the drive gear 47 and follower gear 49. The thread is moved forward or backward according to the direction of rotation.

In this way, the thread 48 for adjustment of the horizontal position is moved forward or backward by the horizontal push member 45, the thread 48 abutting against the left side surface of the rear portion of the outer cylinder 25 whose right side surface is pushed. The outer cylinder 25 is rotated about the center of spherical surface O. The horizontal position (Y-position) of the inner end of the holder H can be adjusted. The Y-position adjusting device Dy is made up of the components 45–49.

(X-Position Adjusting Device Dx)

Referring to FIG. 6, a slider 51 is slidably received in a slider accommodation groove 24b (see FIG. 7A) of the outer cylinder 25.

In FIG. 8, a pin guide recessed groove 51b is formed in the lower surface of the slider 51 and extends in the forward-rearward direction from the rear end to a pin engagement portion 51a on the front-end side. A protrusion 51c for anchoring or positioning is formed on a rear portion of the top surface of the slider 51. A sphere 52, such as a sphere or ball of steel or ruby, is firmly fixed to the surface on the front-end side of the anchoring protrusion 51c.

As shown in FIG. 6, where the slider 51 is received in the slider accommodation groove 24b in the outer cylinder 25, the anchoring protrusion 51c projects out of the outer surface of the outer cylinder 25.

In FIG. 6, a plate 53 for holding the slider is screwed to the flat portion of the top surface of the outer cylinder 25. This plate 53 for holding the slider plugs up the upper end of the slider accommodation groove 24b.

In FIGS. 9A–9C, the plate 53 for holding the slider is provided with plural threaded set holes 53a which are rectangular and extend along the longer side (i.e., in the X-axis direction). A hole 53b is formed in the rear end to permit the protrusion 51c for anchoring to extend through the hole 53b.

As shown in FIG. 6, the protrusion 51c for anchoring the slider 51 received in the slider accommodation groove 24b extends through the hole 53b in the slider-holding plate 53. The protrusion 51c can move within a given range in the forward and backward direction.

As shown in FIG. 4, a lever support member 59 is fixed to the swelling portions 24d of the outer cylinder 25 with screws 60.

As shown in FIGS. 2 and 6, an electric motor 61 for adjustment of the forward and backward position is mounted to the lever support member 59. A drive gear 62 is firmly mounted to the drive shaft of the motor 61 for adjustment of the forward and backward position. A thread 63 for adjustment of the forward and backward position is screwed in a threaded hole formed in the lever support member 59. A follower gear 64 in mesh with the drive gear 62 is securely mounted to the upper end of the thread 63 for adjustment of the forward and backward position. An abutting sphere 65 is secured to the lower end.

In FIG. 6, a shaft 59a is mounted to the lever support member 59. A lever 66 is held to the shaft 59a so as to be rotatable about the Y axis. The lever 66 has a lever engagement portion 66a extending downward in its upper portion. The lever 66 also has a sphere-abutting portion 66b extending forwardly in its front portion. The abutting sphere 65 fixed to the thread 63 for adjustment of the forward and backward position bears against the sphere-abutting portion 66b. When the motor 61 for adjustment of the forward and backward position is driven forward or backward, the thread 63 for adjustment of the forward and backward position is rotated forward or backward via the drive gear 62 and follower gear 64. The thread is moved forward or backward according to the direction of rotation.

The forward or backward motion of the thread 63 for adjustment of the forward and backward position urges the abutting sphere 65 into abutment with the sphere-abutting portion 66b of the lever 66, thus rotating the lever 66. The lever engagement portion 66a pushes against the sphere 52 on the protrusion 51c for anchoring the slider 51 biased forward by the holder H under a back pressure (i.e., atmospheric pressure acting on the outer end). In this way, the slider 51 is moved in the forward and backward direction. Consequently, the position of the inner end of the holder H can be adjusted in the forward and backward direction (in the X-axis direction). The X-position adjusting device Dx is made up of the components 51–53 and 59–66. A holder support device Hs is made up of the components 22–29, G, Dt, Dx, Dy, Dz, etc.

(Operation of Embodiment 1)

When the holder H is inserted into the holder through-hole 26a in the inner cylinder 26 and the pin H6 is inserted into the axial guide hole 24c1 in the outer cylinder 25 and into the pin guide hole 26c in the inner cylinder 26 and moved, the pin H6 abuts against the inner end of the axial guide hole 24c (i.e., the junction with the circumferential guide hole 24c2) (see FIG. 3).

Under this condition, the partition valve 28 is closed. The specimen chamber A is maintained in a vacuum. At this position, a switch (not shown) for rough pumping is turned on to evacuate the specimen preliminary evacuation chamber B to a vacuum. After the chamber has been evacuated sufficiently, the grip H2 for manual operation on the holder H is rotated to move the pin H6 along the circumferential guide hole 24c2 in the outer cylinder 25. The inner cylinder 26 rotates within the inner cylinder through-hole 24a in the outer cylinder 25. At this time, the bevel gear G' rotates the bevel gear G, opening the partition valve 28 that has closed the holder through-hole 23a in the spherical body portion 23. The preliminary evacuation chamber B is placed in communication with the passage for the electron beam.

When the holder through-hole 23a in the spherical body portion 23 is open, the holder H under a back pressure (atmospheric pressure acting to the outer end) is moved inward while the pin H6 is guided by the axial guide hole 24c3 on the inner end side of the outer cylinder 25, the pin guide hole 26c in the inner cylinder 26, and the recessed groove 51b in the slider 51, the groove being used for movement of the pin. The pin H6 engages the pin engagement portion 51a (see FIG. 6).

At this time, the holder pipe H1 is inserted into the holder through-hole 23a in the spherical body portion 23. The holder through-hole 23a in the spherical body portion 23 and the holder pipe H1 are vacuum-sealed by the O-ring H5. The specimen chamber A is maintained in a vacuum. Under this condition, the specimen-holding portion H3 at the inner end of the holder H is placed within the vacuum specimen chamber A, and the specimen-holding portion H3 is placed in the electron beam path extending along the Z-axis. Under this state, the holder H and its pin H6 receive a force that urges them inward by the atmospheric pressure acting on the outer end of the holder H.

When the motor 61 for adjustment of the forward and backward position of the X-position adjusting device Dx is driven to move the forward/backward position adjustment thread 63 forward or backward to thereby rotate the lever 66, the slider 51 is moved forward or backward. Consequently, the forward and backward position of the inner end of the holder H is adjusted.

When the rotational driving motor 32 (see FIG. 5) of the device Dt for the adjustment of the rotational position about the X-axis is driven to rotate the rotating member 22 about the X-axis, the outer cylinder 25, inner cylinder 26, and holder H held to the rotating member 22 rotate about the X-axis, thus adjusting the rotational position of the inner end of the holder H about the X-axis.

When the vertical adjustment motor 41 of the Z-position adjusting device Dz is driven to rotate the outer cylinder 25 about the center of spherical surface O, the inner end of the holder H is adjusted in the up and down direction.

When the left/right position adjustment motor 46 of the Y-position adjusting device Dy is driven to rotate the outer cylinder 25 about the center of spherical surface O, the inner end of the holder H is adjusted in the left and right direction.

Where the holder H is taken out, the holder H is pulled out and the inner end of the holder is moved out of the holder through-hole 23a in the spherical body portion 23 in a reverse manner to the foregoing process. When the front end of the pin H6 extending through the pin guide hole 26c in the inner cylinder 26 is moved along the circumferential guide hole 24c2 in the outer cylinder 25, the inner cylinder 26 is rotated relative to the outer cylinder 25. The partition valve 28 closes the holder through-hole 23a in the spherical body portion 23.

In this Embodiment 1, the pin H6 of the holder H is moved circumferentially using the two cylindrical members 25 and 26 (i.e., the outer cylinder 25 and the inner cylinder 26 having the pin guide holes) to thereby open and close the partition valve 28. The X-position of the pin H6 is adjusted to thereby adjust the X-position of the inner end of the holder H. In this way, a holder support device Hs of simple structure having a detachable cylindrical holder extending along the X-axis can be offered. The position of the inner end of the holder can be adjusted in mutually orthogonal directions, i.e., along the X-, Y-, and Z-axes. Also, the rotational position about the X-axis can be adjusted. Furthermore, the partition valve can be opened and closed.

Accordingly, attachments such as an observational instrument and an analytical instrument can be mounted around the specimen chamber A. In addition, it is possible to cope with increase in the size of the specimen chamber.

(Embodiment 2)

FIG. 10 is a plan view in cross section of a holder support device according to Embodiment 2 of the present invention. Note that like components are indicated by like reference numerals in plural embodiments of the invention including Embodiment 1 and that detailed description of the components already described will be omitted below.

Referring to FIG. 10, a vacuum chamber 68 having a large space has a side wall 69 and a flat side wall 70. The side wall 69 assumes a U-shaped form in the cross-sectional view of FIG. 10. The flat side wall 70 is provided with a support member installation hole 70a and a cylindrical bearing member installation hole 70b. A support member 18 and a cylindrical bearing member 17 are fitted in the holes 70a and 70b, respectively.

The spherical body portion 23 of the outer cylinder 25 is rotatably held to the support member 18. The rotating member 22 is rotatably held to the cylindrical bearing member 17.

The holder support device Hs of this Embodiment 2 is made up of the components 22–29, G, Dt, Dx, Dy, Dz, and other components in the same way as in Embodiment 1. The pin H6 used to open and close the partition valve 28 is employed to adjust the forward and backward position (X-position) of the inner end of the holder H. Therefore, this Embodiment 2 can offer a holder support device Hs of simple structure having a detachable cylindrical holder H extending along the X-axis, in the same way as in Embodiment 1 described above. The position of the inner end of the holder can be adjusted in mutually orthogonal directions, i.e., along the X-, Y-, and Z-axes. Also, the rotational position about the X-axis can be adjusted. Furthermore, the partition valve can be opened and closed.

In consequence, a multiplicity of attachments can be mounted around the vacuum chamber 68. In addition, the holder support device Hs can be used in an instrument which is used in a vacuum environment and permits installation of large specimens, such as a scanning electron microscope, X-ray microanalyzer, or FIB system.

(Modified Embodiments)

While embodiments of the present invention have been described in detail, the invention is not limited thereto. Rather, they can be modified variously within the scope of the invention delineated by the claims of the present application. Modified embodiments of the invention are described below.

In the embodiments above, the slider 51 is moved by the forward/backward position adjustment motor 61 via the lever 66. Instead, the slider 51 may be moved directly by the motor.

The holder support device Hs of the invention can be applied to an instrument utilizing a charged-particle beam other than transmission electron microscopes, scanning electron microscopes, X-ray microanalyzers, and FIB systems.

The above-described holder support device of the present invention can yield the following advantages. The holder support device is simple in structure. The cylindrical holder extending along the X-axis is detachable from the holder support device. The position of the inner end of the holder can be adjusted in mutually orthogonal directions, i.e., along the X-, Y-, and Z-axes. The rotational position about the X-axis can also be adjusted. Furthermore, the partition valve can be opened and closed.

Having thus described my invention with the detail and particularity required by the Patent Laws, what is desired protected by Letters Patent is set forth in the following claims.

The invention claimed is:

1. A holder support device comprising:
  a cylindrical support member extending through a specimen chamber wall and mounted to this specimen chamber wall;
  an outer cylinder inserted in said support member and capable of swinging in Y- and Z-axis directions about a spherical bearing formed on an inner surface of said support member;
  an inner cylinder rotatably mounted in said outer cylinder and directly bearing on said outer cylinder;
  a holder rotatably and slidably mounted in and directly bearing on said inner cylinder and made slidable relative to said inner cylinder by an X-position adjusting device;

a partition valve placed between said inner cylinder and a specimen chamber; and a mechanism for opening and closing said partition valve by rotation of said inner cylinder, relative to said outer cylinder, when said holder rotates.

2. The holder support device of claim 1, wherein:

(A) said holder has a pin on its outer surface;

(B) said inner cylinder is provided with a pin guide hole extending in an X-axis direction, said pin being inserted in said pin guide hole;

(C) said outer cylinder is provided with a circumferential guide hole extending circumferentially of said outer cylinder, said pin extending through the pin guide hole in said inner cylinder being inserted in said circumferential guide hole;

(D) said outer cylinder is further provided with an axial guide hole extending in the X-axis direction, said axial guide hole being continuous with said circumferential guide hole, said pin extending through the pin guide hole in said inner cylinder being inserted in said axial guide hole; and (E) when said pin extending through the pin guide hole in said inner cylinder moves along said circumferential guide hole, said holder and said inner cylinder rotate together.

3. The holder support device of claim 2, wherein said pin inserted in the axial guide hole in said outer cylinder is in engagement with said X-position adjusting device.

4. The holder support device of claim 1, wherein said mechanism for opening and closing said partition valve is composed of a first gear mounted to a shaft that rotatably holds said partition valve and a second gear engaging with said first gear and mounted at a front end of said inner cylinder, and wherein said first gear and said partition valve are rotated by rotation of said inner cylinder to thereby open and close the valve.

5. A holder support device comprising:

an outer wall having an inside space maintained in a vacuum, said outer wall being arranged to surround the outside of a path for a charged-particle beam, said path extending along Z-axis of mutually orthogonal X-, Y-, and Z-axes, said Z-axis being an up-down direction, said X-axis being a forward-backward direction, said Y-axis being a left-right direction;

a cylindrical rotating member extending through said outer wall along the X-axis and held so as to be rotatable about the X-axis;

a spherical bearing disposed at a side of an inner end of said rotating member and provided with a holder through-hole centered on the X-axis, said spherical bearing being centered on the X-axis;

an outer cylinder having a spherical body portion and a cylindrical portion, said spherical body portion being rotatably held by said spherical bearing, said spherical body portion being provided with a holder through-hole through which a front-end portion of a holder extends rotatably and slidably, said holder having a specimen-holding portion in its inner-end portion, said holder having a pin protruding from its outer surface, said cylindrical portion having an inner cylinder through-hole and a pin front-end guide hole, said inner cylinder through-hole permitting an inner cylinder having a holder through-hole to extend therethrough rotatably, said inner cylinder through-hole having a seal ring installation groove in its front-end portion, said pin front-end guide groove acting to guide a front-end portion of the pin of said holder, said front-end portion of said cylindrical portion and a rear-end portion of said spherical body portion having outer surface portions hermetically connected together to form an evacuable preliminary evacuation chamber inside the outer surface portions of the front-end portion of said cylindrical portion and of the rear-end portion of said spherical body portion, said outer cylinder being held by said rotating member so as to be rotatable about a center of said spherical bearing in the up-down direction and left-right direction and about the X-axis, said pin front-end guide hole being formed by connecting an outer end side axial guide hole, a circumferential guide hole, and an inner end side axial guide hole in turn, said outer end side axial guide hole acting to guide the front-end portion of said pin from the outer end of said inner cylinder through-hole in an axial direction, said circumferential guide hole acting to guide the front-end portion of said pin in a circumferential direction, said inner end side axial guide hole acting to guide the front-end portion of said pin toward the inner end in the axial direction;

an inner cylinder having a holder through-hole and a pin guide hole and rotatably held in said inner cylinder through-hole, said holder extending through said holder through-hole slidably, rotatably, and hermetically, said pin of said holder inserted in said holder through-hole extending through said pin guide hole from an inner surface of said holder through-hole to an outer surface of said holder through-hole and protruding, said pin guide hole acting to guide said pin from an outer end of said holder through-hole in the axial direction;

a partition valve for opening and closing the holder through-hole in said spherical body portion when the front-end portion of said pin extending through the pin guide hole in said inner cylinder and protruding outward is moved along the circumferential guide hole in said outer cylinder to rotate said inner cylinder relative to said outer cylinder;

a rotational position adjusting device for adjusting a rotational position of an inner end of said holder about the X-axis by rotating said rotating member about the X-axis;

a Y-position adjusting device for adjusting a Y-position of the inner end of said holder by adjusting the swinging posture of said outer cylinder within an XY plane;

a Z-position adjusting device for adjusting a Z-position of the inner end of said holder by adjusting the swinging posture of said outer cylinder within an XZ plane; and an X-position adjusting device for adjusting an X-position of the inner end of said holder by adjusting an X-position of the front-end portion of said pin within said inner end side axial guide hole.

* * * * *